United States Patent [19]

Segerson et al.

[11] Patent Number: 4,816,673

[45] Date of Patent: Mar. 28, 1989

[54] SHOCK PROOF STEERING MODULE ASSEMBLY

[75] Inventors: Eugene E. Segerson, Tempe; David L. Vowles, Phoenix, both of Ariz.

[73] Assignee: Motorola, Inc., Schaumburg, Ill.

[21] Appl. No.: 248,322

[22] Filed: Sep. 22, 1988

Related U.S. Application Data

[63] Continuation of Ser. No. 68,475, Jul. 1, 1987, abandoned.

[51] Int. Cl.⁴ .............................................. G01D 5/34
[52] U.S. Cl. ............................... 250/239; 250/231 SE
[58] Field of Search .............. 250/231 SE, 237 G, 239

[56] References Cited

U.S. PATENT DOCUMENTS

| | | | |
|---|---|---|---|
| 4,021,665 | 5/1977 | Haas et al. ........................... | 250/239 |
| 4,268,756 | 5/1981 | Crouse et al. ........................ | 250/239 |
| 4,584,485 | 4/1986 | Powers et al. ....................... | 250/239 |
| 4,614,869 | 9/1986 | Hoshino et al. .............. | 250/231 SE |
| 4,712,000 | 12/1987 | Yoshikawa et al. .......... | 250/231 SE |

*Primary Examiner*—Edward P. Westin
*Assistant Examiner*—Khaled Shami
*Attorney, Agent, or Firm*—Charles R. Lewis; Joe E. Barbee

[57] ABSTRACT

A steering module assembly having a contoured housing unit to receive a PC board which has soldered to it a plurality of optoelectronic devices wherein neither said plurality of optoelectronic devices nor said PC board come in direct contact with the housing unit. The PC board also has a saddle element which contains snap retainers to receive each of said plurality of optoelectronic devices. A fitted cover encloses the housing unit.

11 Claims, 2 Drawing Sheets

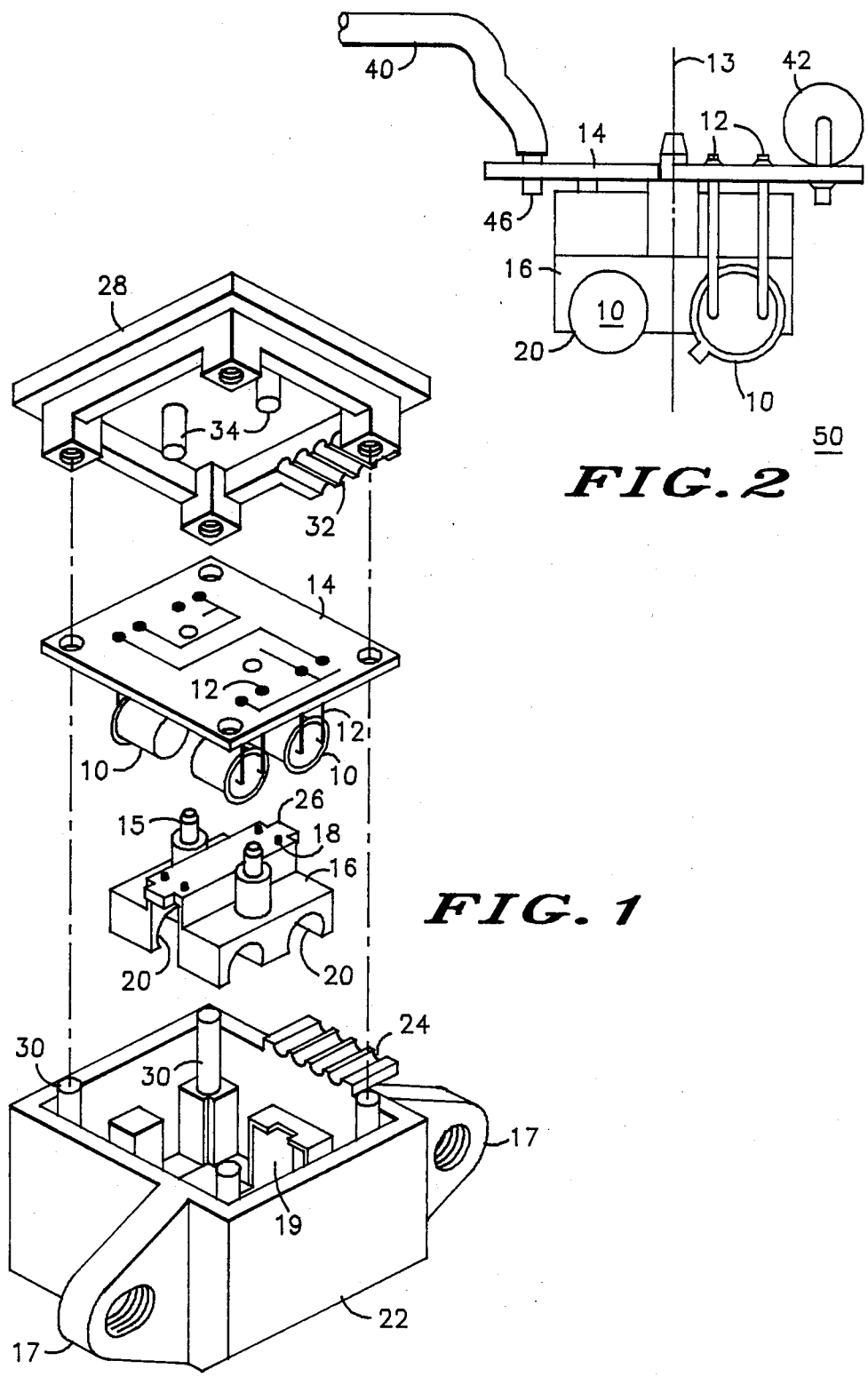

SHOCK PROOF STEERING MODULE ASSEMBLY

This application is a continuation of prior application Ser. No. 068,475, filed Jul. 1, 1987, now abandoned.

BACKGROUND OF THE INVENTION

This invention generally pertains to a steering module assembly incorporating optoelectronic emitters and detectors that provide and retain accurate optical location even when subjected to automotive shock and vibration. Many new cars come with ride control systems to provide the "tightness" of the steering of the automobile. Normally, a "tight" drive is desired, but this is detrimental in panic situations. By sensing amount, direction and rate the steering wheel is being turned, and relaying this information to an onboard computer, these situations can be accounted for and controlled.

The sensing and relaying functions mentioned above can be performed by optoelectronic emitters and detectors. However, such emitters and detectors are rather fragile and, furthermore, a reliable, aligned optical path is required.

No prior art modules for these optoelectronic devices are known to be presently available which provide a rugged and reliable aligned optical path with minimal labor and piece part cost, eliminate stress on the solder joints between the device leads and the PC board caused by thermal cycling and the tolerance variations of the piece parts, allow for manufacture variations in the PC board thickness, allow for dynamic test at the PC board level, and provide sufficient clamping force to maintain the critical position of the devices without deforming the optoelectronic device package or cracking its glass lens.

SUMMARY OF THE INVENTION

The present invention pertains to a shock proof steering module assembly which comprises a mounting means or saddle element mated to a PC board and having snap retainers to receive optoelectronic devices, a housing unit to receive the saddle element and the PC board in a manner that neither the PC board nor the optoelectronic devices directly touches the housing unit, and a cover to enclose the saddle element and the PC board within the housing unit.

Thus, it is an object of the present invention to provide a new and improved steering module assembly which provides a rugged and reliable aligned optical path with minimal labor and piece part cost.

It is a further object of the present invention to provide a new and improved steering module assembly which eliminates stress on solder joints between optoelectronic devices' leads and the PC board caused by thermal cycling and the tolerance variations of the piece parts.

Yet another object of the present invention is to provide a new and improved steering module assembly which allows for manufacture variations in thickness of a PC board housed in the assembly.

Still another object of the present invention is to provide a new and improved steering module assembly which allows for dynamic test at the PC board level.

A further object of the present invention is to provide a new and improved steering module assembly which provides sufficient clamping force to maintain the critical position of the optoelectronic devices without deforming the package or cracking the glass lens of the optoelectronic devices.

These and other objects and advantages of this invention will become apparent to those skilled in the art upon consideration of the accompanying specification, claims and drawings.

BRIEF DESCRIPTION OF THE DRAWINGS

Referring to the drawings wherein like characters indicate like parts throughout the figures:

FIG. 1 is an exploded view of a steering module assembly embodying the present invention;

FIG. 2 is a side-view of a PC board sub-assembly utilizing the present invention;

DESCRIPTION OF THE PREFERRED EMBODIMENTS

Figure 3:
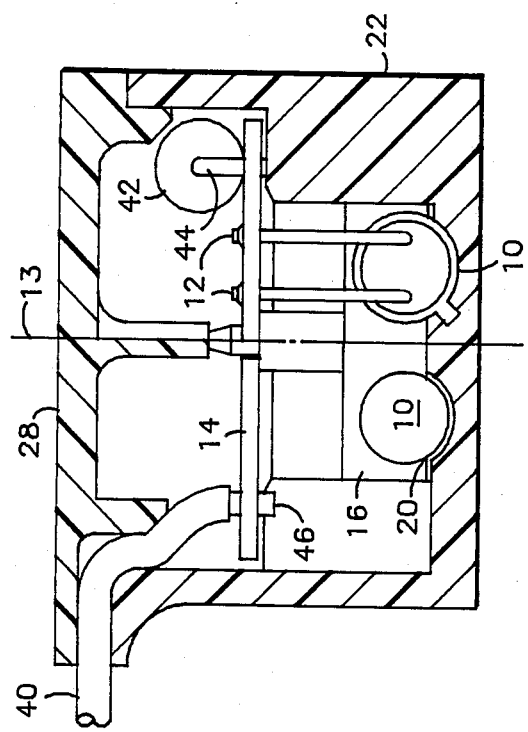
FIG. 3 is a cross-sectional view of the steering module assembly embodying the present invention.

Referring specifically to FIG. 1, optoelectronic devices 10 have wire leads soldered to a PC or interconnect board 14. Optoelectronic devices 10 are cylindrical shaped and have glass lenses on one end and the wire leads 12 on the opposite end. A mounting means or saddle element 16 is located and connected to PC board 14 by saddle clamp pins 15. Saddle element 16 also contains stand offs 18 to prevent the saddle element 16 from damaging PC board 14 when saddle element 16 and PC board 14 are mated. Stand offs 18 are normally nothing more than simple plastic nodules to create a space or maintain a fixed distance between PC board 14 and saddle element 16. Saddle element 16 also possesses 190° snap retainers 20 to receive optoelectronic devices 10. Since 190° snap retainers 20 form slightly more than half a circle, once an object similar in size is snapped into one, it is held tightly in place. It should be noted that while FIG. 1 seems to suggest that wire leads 12 are first soldered to PC board 14 then optoelectronic devices 10 are inserted into snap retainers 20, this is due only to an attempt to display all elements in a clear fashion. If the assembly were performed in this order, unnecessary stress would be placed on wire leads 12 while snapping optoelectronic device 10 into snap retainers 20. Therefore, in actual production, optoelectronic devices 10 are first snapped into snap retainers 20, then wire leads 12 are soldered to PC board 14.

A housing unit 22 serves as an enclosing means and is contoured to receive connected PC board 14 and saddle element 16. The contour of housing unit 22 can be seen more clearly in FIG. 3. To assure proper placement of saddle element 16 in housing unit 22, saddle element 16 has locating notches 26. Housing unit 22 is shaped to form semicircular grooves 24 which reduce the strain on the wires soldered to PC board 14 and protruding from housing unit 22.

Housing unit 22 also has mounting means 17 which are used to mount the assembly in the automobile by screws or pins. In FIG. 1, a portion of an open rectangular groove 19 is also visible. Groove 19 is more easily visible in FIG. 4 and its purpose will be described in more detail later.

A cover 28 fits on housing unit 22 and is connected by heat stake pins 30 located on each corner of housing unit 22. Screws can be utilized instead of heat stake pins 30 to connect cover 28 to housing unit 22. Cover 28 is shaped to form semicircular grooves 32 which correspond with grooves 24 to create circular passages for wires 40 (see FIG. 2) to protrude from housing unit 22 and also provide a strain relief for wires 40. Cover 28 also has cover clamp pins 34 located on the internal surface of cover 28 in corresponding positions as saddle clamp pins 15 on saddle element 16. Cover clamp pins 34 are stand off pins to prevent cover 28 from contacting and damaging PC board 14. A fixed distance is maintained between cover 28 and saddle element 16 by the mating alignment of saddle clamp pins 15 and cover clamp pins 34.

Referring specifically to FIG. 2, the right side of reference line 13 shows a normal side view of PC board sub-assembly 50. The left side of reference line 13 illustrates an offset cross-section of PC board sub-assembly 50.

Referring to the right side of reference line 13 in FIG. 2, PC board 14 is shown with a resistor 42 soldered to it and wire leads 12 from optoelectronic device 10 soldered to it also.

Referring now to the left side of reference line 13 in FIG. 2, saddle element 16 having optoelectronic device snap retainer 20 is clearly visible. One of several lead wires 40 is also shown soldered to PC board 14. Lead wires 40 are utilized to electrically connect PC board 14 to other elements in the automobile such as an on-board computer.

Referring now to FIG. 3, the PC board sub assembly 50 of FIG. 2 is shown placed in housing unit 22 and enclosed by cover 28. It should be noted that PC board 14 does not come in direct contact with housing unit 22 in order to prevent damage to solder joints 44 and 46. The space created between housing unit 22 and PC board 14 protects PC board 14 from shocks and vibrations resulting from driving. This "float" design also allows for manufacturing variations in the thickness of PC board 14.

Optoelectronic devices 10 also do not contact housing unit 22. This protects both optoelectronic devices 10 and wire leads 12 soldered to PC board 14.

Figure 4:
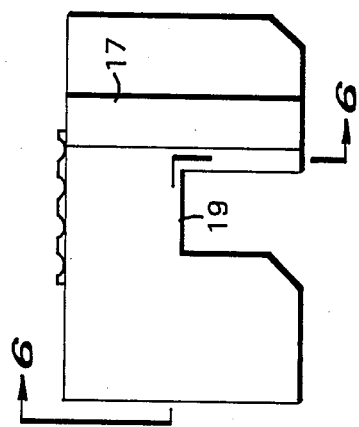
FIG. 4 is a side-view of the steering module assembly embodying the present invention.

FIG. 4 shows a side view of an assembled unit embodying the present invention. Mounting means 17 projects out of the page towards the viewer. Groove 19 is completely visible in this view. The walls comprising groove 19 are partially formed by housing unit 22 and partially formed by saddle element 16 and optoelectronic devices 10. This aspect of the module assembly wherein part of the walls are formed by housing unit 22 and part of the walls are formed by what is contained within housing unit 22 can be seen clearly in FIGS. 5 and 6.

Figure 5:
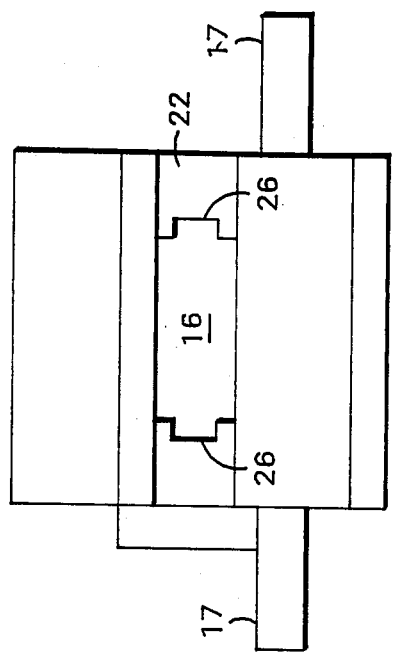
FIG. 5 is a view from the bottom of the steering module assembly embodying the present invention.

Referring specifically to FIG. 5, a bottom view of an assembled unit is shown. Locating notches 26 of saddle element 16 fit into housing unit 22 similar to how pieces of a puzzle fit together. This assures proper alignment during assembly and operation.

Figure 6:
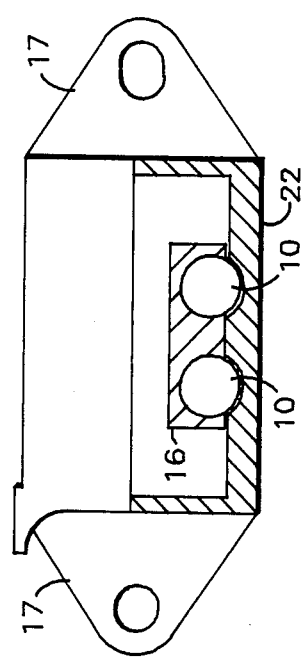
FIG. 6 is another cross-sectional view of the steering module assembly embodying the present invention.

Referring specifically to FIG. 6, a cross-sectional view taken along reference line 6-6 in FIG. 4 is shown. Saddle element 16 and the glass lenses of optoelectronic devices 10 form part of the boundary along with housing unit 22. Once again it should be noted that optoelectronic devices 10 do not directly come in contact with housing unit 22. With the glass lenses of optoelectronic devices 10 exposed to open rectangular groove 19, they can detect signals indicating speed, direction and amount of rotation from a rotational member placed in groove 19.

While a specific embodiment of this invention has been shown and described, further modifications and improvements will occur to those skilled in the art. For instance, alternate means for connecting the housing unit to the cover or for interconnecting the saddle element, the PC board, and the cover other than pins are available. Furthermore, the optoelectronic devices utilized have not been specifically described, but it should be clear to those skilled in the art that devices such as optoelectronic emitters and detectors packaged in a TO-18 can are ideally suited for this invention. We desire it to be understood, therefore, that this invention is not limited to the particular form shown and we intend to cover all modifications which do not depart from the spirit and scope of this invention.

We claim:

1. A steering module assembly comprising:
   a PC board;
   a plurality of optoelectronic devices;
   means for connecting said optoelectronic devices to said PC board;
   a saddle element mated to said PC board and adapted to receive and fixedly hold in place said plurality of optoelectronic devices;
   a housing unit to contain said saddle element and said PC board;
   a cover to enclose said saddle element and said PC board within said housing unit; and
   means for attaching said cover to said housing unit with said saddle element being received and aligned within said housing unit such that said PC board does not directly contact said housing unit thereby provide shock and vibration protection for said steering module assembly.

2. A steering module assembly as recited in claim 1 wherein each of said plurality of optoelectronic devices has wire leads.

3. A steering module assembly as recited in claim 2 wherein said means of connecting said optoelectronic devices to said PC board is said wire leads being soldered to said PC board.

4. A steering module assembly as recited in claim 1 wherein said means for attaching said housing unit and said cover is by a plurality of heat stake pins.

5. A steering module assembly as recited in claim 1 wherein said saddle element contains a snap retainer to receive each of said plurality of optoelectronic devices.

6. A steering module assembly as recited in claim 1 wherein said housing unit has a contoured internal shape to fit and receive said saddle element with both said PC board and said optoelectronic devices indirectly touching said housing unit through said saddle element.

7. A steering module assembly as recited in claim 1 wherein said cover includes insulating means to prevent damage to said PC board which may result from contact between said cover and said PC board.

8. A steering module assembly as recited in claim 1 wherein a plurality of lead wires are soldered to said PC board.

9. A steering module assembly as recited in claim 8 wherein said housing unit and said cover each have a plurality of semicircular grooves formed on their contacting surfaces so as to create circular passages for said lead wires to protrude, said circular passages also providing strain relief for said lead wires.

10. A vehicle steering module assembly comprising:
a rectangular PC board;
a plurality of cylindrical optoelectronic devices having wire leads soldered to said PC board;
a plastic saddle element adapted to receive said optoelectronic devices wherein said optoelectronic devices create a snap fit into said saddle;
a plurality of saddle clamp pins to both connect and locate said PC board with said saddle element;
a plurality of stand offs to prevent said PC board from lying directly on said saddle element;
a rectangular housing unit to receive said saddle element and said PC board;
first and second locating notches on said saddle element and corresponding first and second grooves formed on said housing unit to center and receive said saddle element;
a cover to enclose said saddle element and said PC board within said housing unit;
a heat stake pin located on each corner of said housing unit for attaching said cover to said housing unit; and
a plurality of cover clamp pins located on the internal surface of said cover in corresponding positions as said plurality of saddle clamp pins to prevent said cover from contacting said PC board, thereby eliminating pressure on solder joints created when said wire leads are soldered to said PC board;
said housing unit having a fitted solid mount internal shape to receive said saddle element without said PC board and said optoelectronic devices directly touching said housing unit to provide shock and vibration protection for said vehicle steering module assembly.

11. An optoelectronic device housing assembly comprising:
an interconnect board having optoelectronic devices electrically connected thereto;
mounting means for fixedly holding the optoelectronic devices, the mounting means having locating pins for holding the interconnect board and the mounting means in a fixed spaced relationship;
enclosing means for enclosing the interconnect board and the mounting means, the enclosing means having an opening for exposing a portion of the mounting means along with the optoelectronic devices; and
a cover for mating with the enclosing means and covering the interconnect board such that said interconnect board and said optoelectronic devices do not directly contact the enclosing means thereby providing said housing assembly shock and vibration protection.

* * * * *

UNITED STATES PATENT AND TRADEMARK OFFICE
CERTIFICATE OF CORRECTION

PATENT NO. : 4,816,673

DATED : March 28, 1989

INVENTOR(S) : Eugene E. Segerson et al

It is certified that error appears in the above-identified patent and that said Letters Patent is hereby corrected as shown below:

Column 4, line 37, claim 1, change "provide" to --providing--.

Signed and Sealed this

Sixth Day of March, 1990

Attest:

JEFFREY M. SAMUELS

*Attesting Officer*    *Acting Commissioner of Patents and Trademarks*